United States Patent
Wang et al.

(10) Patent No.: US 10,978,495 B2
(45) Date of Patent: Apr. 13, 2021

(54) ARRAY SUBSTRATE AND METHOD OF MANUFACTURING THE SAME, AND DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Pei Wang, Beijing (CN); Hyunjin Kim, Beijing (CN); Kai Zhang, Beijing (CN); Dawei Shi, Beijing (CN); Wentao Wang, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

(*) Notice: Subject to any disclaimer, the term of this patent is extended or adjusted under 35 U.S.C. 154(b) by 104 days.

(21) Appl. No.: 16/344,742

(22) PCT Filed: May 9, 2018

(86) PCT No.: PCT/CN2018/086187
§ 371 (c)(1),
(2) Date: Apr. 24, 2019

(87) PCT Pub. No.: WO2018/214732
PCT Pub. Date: Nov. 29, 2018

(65) Prior Publication Data
US 2019/0273096 A1    Sep. 5, 2019

(30) Foreign Application Priority Data
May 23, 2017   (CN) .......................... 201710370614.2

(51) Int. Cl.
*H01L 27/12* (2006.01)
*H01L 23/60* (2006.01)

(52) U.S. Cl.
CPC ............ *H01L 27/124* (2013.01); *H01L 23/60* (2013.01); *H01L 27/127* (2013.01);
(Continued)

(58) Field of Classification Search
CPC .............. H01L 27/124; H01L 27/1218; H01L 27/1288; H01L 27/1296
See application file for complete search history.

(56) References Cited

U.S. PATENT DOCUMENTS

2012/0100653 A1    4/2012   Chen et al.
2014/0084286 A1*   3/2014   Jeon ................... H01L 33/0041
                                                          257/43
(Continued)

FOREIGN PATENT DOCUMENTS

CN    202189210 U    4/2012
CN    103278953 A    9/2013
(Continued)

OTHER PUBLICATIONS

International Search Report and Written Opinion issued in International Application No. PCT/CN2018/086187, dated Aug. 7, 2018, with English translation.

(Continued)

*Primary Examiner* — Douglas M Menz
(74) *Attorney, Agent, or Firm* — McDermott Will & Emery LLP

(57) ABSTRACT

An array substrate includes an electrostatic shielding layer disposed on a substrate, an isolating layer covering the electrostatic shielding layer, gate lines, data lines, and thin film transistors. The gate lines, the data lines, and the thin film transistors are disposed on the isolating layer. An (Continued)

orthographic projection of a pattern of the electrostatic shielding layer on the substrate covers an orthographic projection of at least one of a pattern of the gate lines, a pattern of the data lines, and a pattern of the thin film transistors on the substrate.

12 Claims, 4 Drawing Sheets

(52) U.S. Cl.
CPC ...... *H01L 27/1218* (2013.01); *H01L 27/1288* (2013.01); *H01L 27/1296* (2013.01)

(56) References Cited

U.S. PATENT DOCUMENTS

2017/0192319 A1* 7/2017 Zhang ............... G02F 1/136286
2019/0273096 A1   9/2019 Wang et al.

FOREIGN PATENT DOCUMENTS

| CN | 105304559 | A | 2/2016 |
| CN | 105954922 | A | 9/2016 |
| CN | 107204345 | A | 9/2017 |

OTHER PUBLICATIONS

First Office Action issued in Chinese Application No. 201710370614.2, dated Nov. 26, 2018, with English translation.
Refusal Decision issued in Chinese Application No. 201710370614.2, dated Feb. 28, 2019, with English translation.

\* cited by examiner

ARRAY SUBSTRATE AND METHOD OF MANUFACTURING THE SAME, AND DISPLAY DEVICE

CROSS-REFERENCE TO RELATED APPLICATION

This application is a national phase entry under 35 USC 371 of International Patent Application No. PCT/CN2018/086187 filed on May 9, 2018, which claims priority to Chinese Patent Application No. 201710370614.2, filed with the Chinese Patent Office on May 23, 2017, titled "ARRAY SUBSTRATE AND MANUFACTURING METHOD THEREOF, AND DISPLAY DEVICE", which are incorporated herein by reference in their entirety.

TECHNICAL FIELD

The present disclosure relates to the field of display technologies, and in particular, to an array substrate and a method of manufacturing the same, and a display device.

BACKGROUND

An array substrate, i.e., a thin film transistor (TFT) substrate including thin film transistors, is one of important components of a display product. The array substrate includes a base substrate, and the thin film transistors are disposed on the base substrate.

SUMMARY

Some embodiments of the present disclosure provide an array substrate, and the array substrate includes:

an electrostatic shielding layer disposed on a base substrate;

an isolating layer covering the electrostatic shielding layer; and gate lines, data lines and thin film transistors disposed on the isolating layer.

An orthographic projection of at least one of a pattern of the gate lines, a pattern of the data lines and a pattern of the thin film transistors on the base substrate is within a range of an orthographic projection of a pattern of the electrostatic shielding layer on the base substrate.

In some embodiments, the pattern of the electrostatic shielding layer includes a plurality of lateral portions and a plurality of longitudinal portions, and the plurality of lateral portions and the plurality of longitudinal portions intersect each other to form a grid-like pattern.

An orthographic projection of a corresponding gate line on the base substrate is within a range of an orthographic projection of each lateral portion on the base substrate, and an orthographic projection of a corresponding data line on the base substrate is within a range of an orthographic projection of each longitudinal portion on the base substrate.

In some embodiments, the lateral portions further include a plurality of protruding portions formed on a same side and each connected to a corresponding longitudinal portion, and an orthographic projection of a corresponding thin film transistor on the substrate is within a range of an orthographic projection of a combination of a protruding portion, a portion of a lateral portion that is connected to the protruding portion, and a portion of a longitudinal portion that is connected to the protruding portion on the base substrate.

In some embodiments, a width of the lateral portion perpendicular to an extension direction of a corresponding gate line is greater than a line width of the gate line;

a width of the longitudinal portion perpendicular to an extension direction of a corresponding data line is greater than a line width of the data line; and an area of a region where the combination of the protruding portion, the portion of the lateral portion that is connected to the protruding portion, and the portion of the longitudinal portion that is connected to the protruding portion is located is greater than an area of a region where the thin film transistor is located.

In some embodiments, the electrostatic shielding layer includes polysilicon doped with ions.

In some embodiments, the electrostatic shielding layer is located in at least one of a display area of the array substrate or a gate driver area of the array substrate.

Some embodiments of the present disclosure provide a method of manufacturing the array substrate, and the method includes:

forming an electrostatic shielding layer, and an isolating layer covering the electrostatic shielding layer on the base substrate in sequence; and forming gate lines, data lines and thin film transistors on the isolating layer, wherein an orthographic projection of at least one of a pattern of the gate lines, a pattern of the data lines and a pattern of the thin film transistors on the base substrate is within a range of an orthographic projection of a pattern of the electrostatic shielding layer on the base substrate.

In some embodiments, forming an electrostatic shielding layer includes:

forming a polysilicon thin film covering the base substrate;

patterning the polysilicon thin film to form a polysilicon pattern layer; and doping ions in the polysilicon pattern layer to form an electrostatic shielding layer, wherein the electrostatic shielding layer has a predetermined resistance.

In some embodiments, after forming the electrostatic shielding layer, the manufacturing method further includes:

heating and activating the electrostatic shielding layer to increase an ordering degree of arranging the doped ions in the electrostatic shielding layer.

In some embodiments, forming an electrostatic shielding layer includes:

directly forming a nitrogen-doped polysilicon thin film covering the base substrate; and patterning the nitrogen-doped polysilicon thin film to form an electrostatic shielding layer.

In some embodiments, a pattern of the formed electrostatic shielding layer includes:

a plurality of lateral portions and a plurality of longitudinal portions, and the plurality of lateral portions and the plurality of longitudinal portions intersect each other to form a grid-like pattern.

An orthographic projection of a corresponding data line on the base substrate is within a range of an orthographic projection of each lateral portion on the base substrate covers an orthographic projection of a corresponding gate line on the base substrate, and an orthographic projection of each longitudinal portion on the base substrate.

In some embodiments, the lateral portions further include a plurality of protruding portions formed on a same side and each connected to a corresponding longitudinal portion, an orthographic projection of a corresponding thin film transistor on the substrate is within a range of an orthographic projection of a combination of a protruding portion, a portion of a lateral portion that is connected to the protruding portion, and a portion of a longitudinal portion that is connected to the protruding portion on the base substrate.

In some embodiments, a width of the lateral portion perpendicular to an extension direction of a corresponding gate line is greater than a line width of the gate line, a width of the longitudinal portion perpendicular to an extension direction of a corresponding data line is greater than a line width of the data line, and an area of a region where the combination of the protruding portion, the portion of the lateral portion that is connected to the protruding portion, and the portion of the longitudinal portion that is connected to the protruding portion is located is greater than an area of a region where the thin film transistor is located.

Some embodiments of the present disclosure provide a display device, and the display device includes the array substrate described above.

BRIEF DESCRIPTION OF THE DRAWINGS

In order to describe technical solutions in embodiments of the present disclosure more clearly, the accompanying drawings used in the description of embodiments will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

Figure 1:
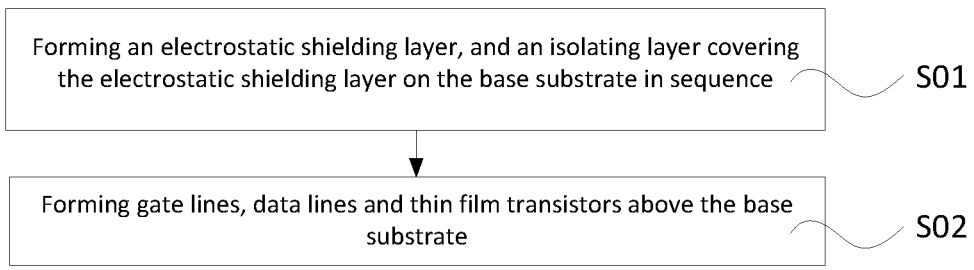
FIG. 1 is a flow chart of a method of manufacturing an array substrate in accordance with some embodiments of the present disclosure.

The technical solutions in embodiments of the present disclosure will be described clearly and completely with reference to the accompanying drawings in the embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

It will be noted that, unless otherwise defined, all terms (including technical and scientific terms) used in embodiments of the present disclosure have the same meaning as commonly understood by one of ordinary skill in the art to which this disclosure belongs. It will also be understood that terms such as those defined in the ordinary dictionary should be interpreted as having meanings consistent with their meaning in the context of the related art, and not interpreted in an idealized or extremely formalized meaning unless explicitly defined herein.

For example, the terms "first", "second" and similar terms used in the description and the claims of the present disclosure are not intended to mean any order, quantity or importance, and are merely used to distinguish different components. The words "include" or "comprise", etc. are intended to mean that an element or object that precedes the word includes an element or object listed after the word and equivalents thereof, and does not exclude other element or object. Orientations or positional relationships indicated by terms "lateral", "longitudinal", etc. are based on orientations or positional relationships shown in the accompanying drawings, merely for the convenience of explaining simplified descriptions of the technical solutions of the present disclosure, but not to indicate or imply that the referred devices or elements must have a particular orientation, or must be constructed or operated in a particular orientation. Therefore they should not be construed as limitations to the present disclosure.

In addition, since actual dimensions of structures such as signal lines and TFT elements, etc. involved in the embodiments of the present disclosure are very small, for the sake of clarity, the dimension of each structure in the accompanying drawings of the embodiments of the present disclosure is enlarged, and does not represent the actual dimension unless otherwise stated.

In the related art, in a process of manufacturing an array substrate, there are a plurality of manufacturing processes performed on a base substrate (usually a glass substrate), thus the glass substrate is usually in contact with a platform several times. Static electricity will be accumulated in the platform during a process that a surface of the glass substrate adjacent to the platform is in contact with the platform. For example, static electricity will be generated on a roller for transport or a support pin for support during a period that the glass substrate is in contact with the roller or the support pin. A re-contact of the glass substrate with the roller or the support pin will cause an electro-static discharge (ESD). Since the base substrate has a thin thickness, a charge released during the electro-static discharge is transmitted to TFT(s) on the glass substrate, which causes a failure of performances of the TFT elements, thereby causing defects such as bright spots and black spots in a display product.

With regard to the above problem, as shown in FIG. 1, some embodiments of the present disclosure provide a method of manufacturing an array substrate, and the method includes but is not limited to step 02 (S02), i.e., forming gate lines, data lines and thin film transistors above the base substrate. Before the S02 described above, the method further includes step 01 (S01), i.e., forming an electrostatic shielding layer, and an isolating layer covering the electrostatic shielding layer on the base substrate in sequence. An orthographic projection of a pattern of the electrostatic shielding layer on the base substrate covers an orthographic projection of at least one of a pattern of the gate lines, a pattern of the data lines and a pattern of the thin film transistors on the base substrate.

It will be noted that, the S02 described above is performed after the S01. Therefore, the gate lines, the data lines and the thin film transistors are formed on the isolating layer covering the electrostatic shielding layer. The isolating layer is made of an insulating material and is configured to isolate the electrostatic shielding layer from subsequently formed signal lines (the gate lines and the data lines) and thin film transistors (TFTs). Processes of manufacturing the gate lines, the data lines and the TFTs, and a structure of each TFT (such as a top gate type or a bottom gate type) may follow the related design in the prior art, which is not limited by the embodiments of the present disclosure.

In some embodiments, the electrostatic shielding layer is made of a metal material, a semiconductor material or an ion-doped semiconductor material having a certain adjustable resistance, as long as the material is conductive, and may shield the static electricity induced by a surface of the base substrate away from the electrostatic shielding layer.

Based on this, according to the manufacturing method described above provided by the embodiments of the present disclosure, the electrostatic shielding layer is provided between the base substrate and the gate lines, the data lines and the TFTs, and the orthographic projection of the pattern of the electrostatic shielding layer on the base substrate covers the orthographic projection of at least one of the pattern of the gate lines, the pattern of the data lines and the pattern of the thin film transistors on the base substrate, thus a shielding method may be adopted to avoid that the static electricity accumulated by the platform during the ESD is transmitted to a TFT through a corresponding gate line or a corresponding data line, or is directly transmitted to the TFT element, thereby avoiding various defects such as the bright spots and the black spots in a display product due to the ESD, and improving a product yield.

On the basis of the above, since the ESD of the surface of the base substrate away from the electrostatic shielding layer of the array substrate may occur in any region of the array substrate, in order to further improve a shielding effect of the electrostatic shielding layer, in some embodiments, the electrostatic shielding layer is disposed beneath the gate lines, the data lines and the TFTs, i.e., the orthographic projection of the pattern of the electrostatic shielding layer on the base substrate covers the orthographic projections of the patterns of the gate lines, the data lines and the thin film transistors on the base substrate.

Figure 2:
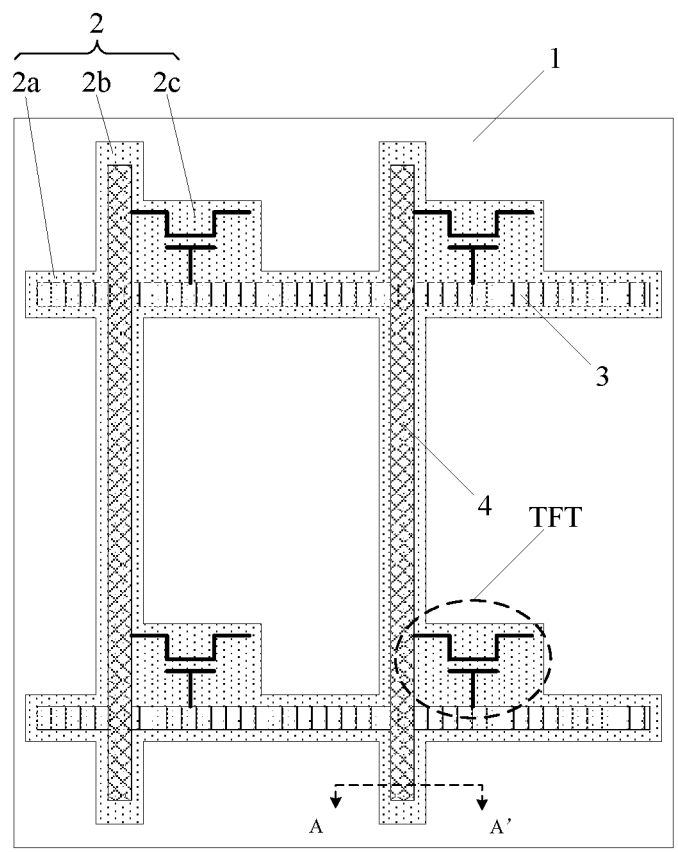
FIG. 2 is a schematic diagram showing a local structure of an array substrate in accordance with some embodiments of the present disclosure.

In some embodiments, as shown in FIG. 2, the pattern of the electrostatic shielding layer 2 includes a plurality of lateral portions 2a and a plurality of longitudinal portions 2b, and the plurality of lateral portions 2a and the plurality of longitudinal portions 2b intersect each other to form a grid-like pattern. Orthographic projections of the lateral portions 2a on the base substrate 1 cover orthographic projections of gate lines 3 on the base substrate 1, and orthographic projections of the longitudinal portions 2b on the base substrate 1 cover orthographic projections of data lines 4 on the base substrate 1.

It will be noted that, in order to clearly show the pattern of the electrostatic shielding layer 2, the subsequently formed gate lines 3, data lines 4, and TFTs have been shown in FIG. 2. In addition, the specific number of the gate lines 3, the data lines 4, and the TFTs is merely schematic.

The terms "lateral", "longitudinal" described above are merely to illustrate that portions of the electrostatic shielding layer 2 that respectively shield the gate lines 3 and the data lines 4 are disposed relatively, and are not to limit directions of the gate lines and the data lines.

Of course, the array substrate described above further includes structures such as a gate insulating layer, and an inter layer dielectric layer etc. for insulating the metal in layers during a process of forming the gate lines, the data lines and the TFTs. Since the gate insulating layer, the inter layer dielectric layer and the previously formed isolating layer are all transparent insulating layers, they are not shown in FIG. 2.

In some embodiments, as shown in FIG. 2, the lateral portions 2a further include a plurality of protruding portions 2c formed on a same side and each connected to a corresponding longitudinal portion 2b. An orthographic projection of a combination of a protruding portion 2c, a portion of a lateral portion 2a that is connected to the protruding portion 2c, and a portion of a longitudinal portion 2b that is connected to the protruding portion 2c on the base substrate 1 covers an orthographic projection of a corresponding thin film transistor to be formed (shown by an abbreviation "TFT" in FIG. 2) on the base substrate 1. As shown in FIG. 2, "a plurality of protruding portions 2c formed on a same side" means that some of protruding portion 2c are formed on a side of portions of a corresponding lateral portion 2a extending in a lateral direction.

In some embodiments, in order to fully shield the charge released by the ESD, an area where the electrostatic shielding layer 2 is located is greater than an area where each of the structures described above is located. For example, as shown in FIG. 2, a width of the lateral portion 2a in a direction perpendicular to an extension direction of a corresponding gate line 3 is greater than a line width of the gate line 3, a width of the longitudinal portion 2b in a direction perpendicular to an extension direction of a corresponding data line 4 is greater than a line width of the data line 4, and an area of a region where the combination of the protruding portion 2c, the portion of the lateral portion 2a that is connected to the protruding portion 2c, and the portion of the longitudinal portion 2b that is connected to the protruding portion 2c is located is greater than an area of a region where the TFT is located.

Here, the gate line 3 has a "length" dimension from left to right shown in FIG. 2 and a "width" dimension perpendicular to the length in the plane shown in FIG. 2. Therefore, the width of the lateral portion 2a in a direction perpendicular to an extension direction of a corresponding gate line 3 is a corresponding dimension of the lateral portion 2a perpendicular to the length of the lateral portion 2a shown in FIG. 2. The data line 4 has a "width" dimension from left to right shown in FIG. 2 and a "length" dimension perpendicular to the width. Therefore, the width of the longitudinal portion 2b in a direction perpendicular to an extension direction of a corresponding data line 4 is a corresponding dimension of the longitudinal portion 2b from left to right shown in FIG. 2. For the TFT, since the orthographic projection of the combination of the protruding portion 2c, the portion of the lateral portion 2a that is connected to the protruding portion 2c, and the portion of the longitudinal portion 2b that is connected to the protruding portion 2c on the base substrate 1 covers the orthographic projection of the TFT on the base substrate 1, the area of the region where the combination is located is greater than the area of the region where the TFT is located, i.e., the length dimension from left to right and the width dimension in a direction perpendicular to the length of the region where the combination is located are both greater than a corresponding length dimension and a corresponding width dimension of the region where the TFT is located.

It will be known from the foregoing description that, in some embodiments, the electrostatic shielding layer is made of a metal material, such as deposited elemental molybdenum (Mo). In some other embodiments, the electrostatic shielding layer is made of a semiconductor material.

However, since a resistance of the metal material is small, and there is an overlapping region between the electrostatic shielding layer and the gate lines, the data lines, and the TFTs, the electrostatic shielding layer made of a metal material is easy to generate a parasitic capacitance with a gate metal layer (including gate lines and gates of the TFTs, usually called a gate layer), a source-drain metal layer (including data lines, sources and drains of the TFTs, usually called a SD layer) and active layers in the TFTs, and an energy consumption of a product may be increased. Furthermore, since a conductivity of a semiconductor material is between a conductivity of a conductor metal and a conductivity of an insulator, a resistance of the semiconductor material is large and the shielding effect is limited. With regard to the above problem, in some embodiments of the present disclosure, an ion-doped semiconductor material having a certain adjustable resistance is used as the material of the electrostatic shielding layer.

In the case described above, in some embodiments, the step of forming an electrostatic shielding layer include steps 11-13 (S11-S13).

In step 11 (S11), a polysilicon thin film covering the base substrate is formed on the base substrate.

In step 12 (S12), the polysilicon thin film is patterned to form a polysilicon pattern layer, for example, forming a pattern consisting of the lateral portions, the longitudinal portions and the protruding portions described above.

In step 13 (S13), ions is doped in the polysilicon pattern layer to form an electrostatic shielding layer. The formed electrostatic shielding layer has a predetermined resistance.

It will be noted that, in some embodiments, the electrostatic shielding layer has a predetermined resistance by controlling a doping concentration and/or a type of the doped ions. The predetermined resistance is a resistance making the electrostatic shielding layer not easy to generate a parasitic capacitance with at least one of the gate metal layer, the source-drain metal layer and the active layers in the TFTs and optimizing the shielding effect.

In some embodiments, the step of forming a polysilicon thin film covering the base substrate includes: forming an amorphous silicon (a-Si) thin film covering the base substrate, and crystallizing the amorphous silicon thin film to convert the amorphous silicon thin film into a polycrystalline silicon (P-Si) thin film.

In some embodiments, a crystallization process includes a solid-phase method and an excimer laser anneal (ELA) crystallization process. In some embodiments, when the ELA crystallization process is adopted to crystallize the amorphous silicon thin film, in order to avoid a flash explosion of hydrogen contained in a manufacturing of the amorphous silicon, the amorphous silicon thin film is dehydrogenated before the ELA crystallization process. A dehydrogenation process may follow the prior art, which the embodiments of the present disclosure will not describe again.

Here, considering that a structure of the amorphous silicon has a plurality of defects, an adjusting effect of a resistance of the ion-doped amorphous silicon is poor. Therefore, in some embodiments of the present disclosure, the formed polysilicon thin film is doped with ions to obtain a suitable adjusting resistance.

The patterning process described above may be any process through which a film layer (one or more film layers, in the embodiments of the present disclosure, the film layer is an entire layer of the polysilicon thin film deposited on the base substrate) is processed to form a specific pattern. In some embodiments, the patterning process is a process using a mask to expose and develop a photoresist, to etch the film layer (a dry etch when specific to the polysilicon film), and to remove the photoresist (specifically, to strip the photoresist).

When the subsequently formed active layers of the TFTs are low temperature polysilicon (LTPS), since the LTPS is easy to leak currents due to an impact of illumination, and a light transmittance of the ion-doped polysilicon will be reduced, the electrostatic shielding layer disposed beneath the TFTs also has a light shielding effect of a light shielding (abbreviated as LS) layer.

In some embodiments, for the case where the electrostatic shielding layer includes ion-doped polysilicon having a certain adjusting resistance described above, after the step of forming the electrostatic shielding layer, the manufacturing method described above further includes the following steps. That is, the electrostatic shielding layer is activated by heating to increase an ordering degree of arranging the doped ions in the electrostatic shielding layer.

By heating the electrostatic shielding layer, a thermal motion of the heated doped ions may increase a uniformity of diffusion of the doped ions in a main body of the polysilicon, so that the ordering degree of arranging the doping ions is increased, and the shielding effect of the electrostatic shielding layer may be further enhanced.

In some embodiments, the step of activating the electrostatic shielding layer by heating is performed after the step of forming the electrostatic shielding layer, and before the subsequent structures such as the gate lines, the data lines and the TFTs are formed. Optionally, when the subsequently formed structures such as the gate lines, the data lines and the TFTs also need to be activated by heating, an entire substrate is heated and the electrostatic shield layer and remaining film layers are activated. The specific steps may be flexibly adjusted according to the process of manufacturing the array substrate described above, which is not limited by the embodiments of the present disclosure.

In some embodiments, the electrostatic shielding layer includes a nitrogen-doped polysilicon (N+a-Si) material. In this case, the step of manufacturing the electrostatic shielding layer includes, for example, directly forming a nitrogen-doped polysilicon thin film covering the base substrate by using a deposition (abbreviated as Dep) method, and patterning the nitrogen-doped polysilicon thin film to form an electrostatic shielding layer.

Here, the term "directly" described above indicates that nitrogen (N) in the formed N+a-Si is directly formed in a deposited raw material during deposition, and is not subsequently formed through the ion doping process such as an ion implantation process. This setting makes the process simple and has less impact on productivity.

A method of manufacturing the array substrate provided by the embodiments of the present disclosure is exemplified below. The manufacturing method includes steps a-e.

Figure 4:
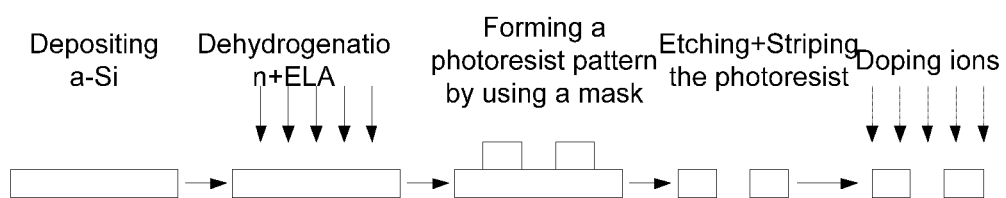
FIG. 4 is a schematic diagram showing a step-by-step structure of manufacturing an array substrate in accordance with some embodiments of the present disclosure.
Figure 5:
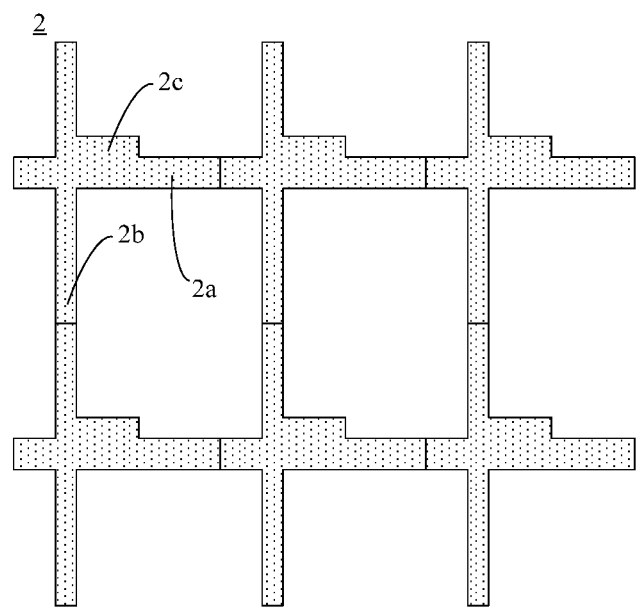
FIG. 5 is a schematic diagram showing a step-by-step structure of further manufacturing an array substrate in accordance with some embodiments of the present disclosure.

In step a, as shown in FIG. 4, the a-Si thin film is deposited on the base substrate (not shown in FIG. 4) by using the deposition method, and the a-Si is crystallized and converted into the P-Si through the dehydrogenation and the ELA crystallization process. Then the P-Si pattern is defined by using a mask to expose the photoresist, performing the dry etch, and striping the photoresist. This pattern needs to block the regions where the subsequently formed gate lines, data lines, and TFTs are located to completely shield the static electricity induced by a surface of the base substrate (glass) away from the pattern through the platform. The P-Si pattern is doped with ions to obtain a certain predetermined resistance of the P-Si. If the resistance is too large, the shielding effect will be poor, and if the resistance is too small, a certain parasitic capacitance will be generated between the P-Si pattern and the subsequent structures to be shielded. The pattern of the electrostatic shielding layer (LS layer) 2 after completing the ion doping process is as shown in FIG. 5, that is, the pattern includes lateral portions 2a and longitudinal portions 2b intersecting each other, and protruding portions 2c extending from the lateral portions 2a and each connected to a corresponding longitudinal portion 2b.

After that, an isolating layer covering the electrostatic shield layer 2 is formed on the base substrate.

Figure 6:
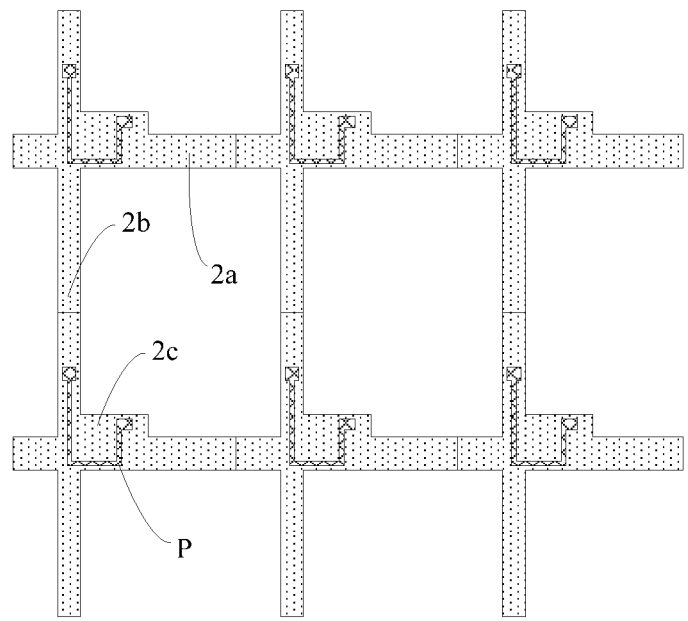
FIG. 6 is a schematic diagram showing a step-by-step structure of further manufacturing an array substrate in accordance with some embodiments of the present disclosure.

In step b, as shown in FIG. 6, a polysilicon active layer (indicated by P in FIG. 6) is formed on the isolating layer. The process may follow the existing conventional process. Since the polysilicon active layer is a structure applied to the a LTPS TFT and has a pattern similar to an inverted character "11", the pattern of the polysilicon active layer is blocked by the combination of the formed protruding portion 2c, the portion of the lateral portion 2a that is connected to the protruding portion 2c and the portion of the longitudinal portion 2b that is connected to the protruding portion 2c described above.

In some examples, a source contact region and a drain contact region disposed facing each other and formed through the ion doping are formed at both ends of the pattern "H" of the polysilicon active layer, so as to improve a performance during a subsequent contact with the source and the drain, and to improve the performance of the TFT.

After that, a gate insulating layer covering the polysilicon active layer is formed on the isolating layer.

Figure 7:
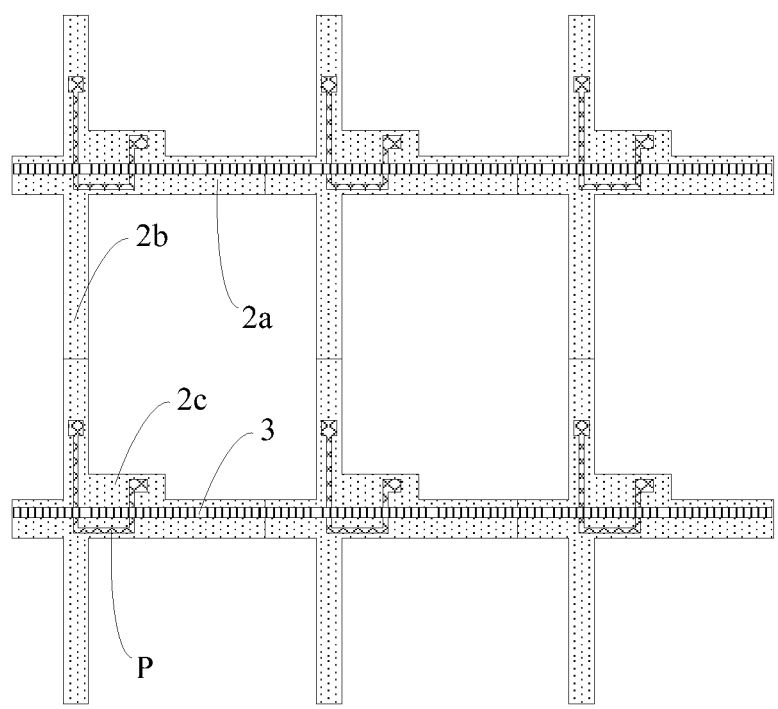
FIG. 7 is a schematic diagram showing a step-by-step structure of further manufacturing an array substrate in accordance with some embodiments of the present disclosure.

In step c, as shown in FIG. 7, a pattern of the gate lines 3 is formed on the gate insulating layer, and the process may follow the existing conventional process. The pattern of the gate lines 3 is entirely blocked by the lateral portions 2a below. A region where the pattern of the gate lines 3 overlaps with the polysilicon active layer having a pattern similar to the inverted character "H" is regions where gates are located.

In step d, an inter layer dielectric (abbreviated as ILD) layer covering the gate lines 3 is formed, and via holes penetrating the inter layer dielectric layer and the gate insulating layer below are formed in the inter layer dielectric layer to expose the source contact region and the drain contact region of the polysilicon active layer.

After that, the substrate is activated by heating. This setting may not only improve the ordering degree of arranging the doped ions in the electrostatic shielding layer 2, but also make implanted ions in the source contact region and the drain contact region of the polysilicon active layer orderly arranged, thereby simplifying the process.

Figure 8:
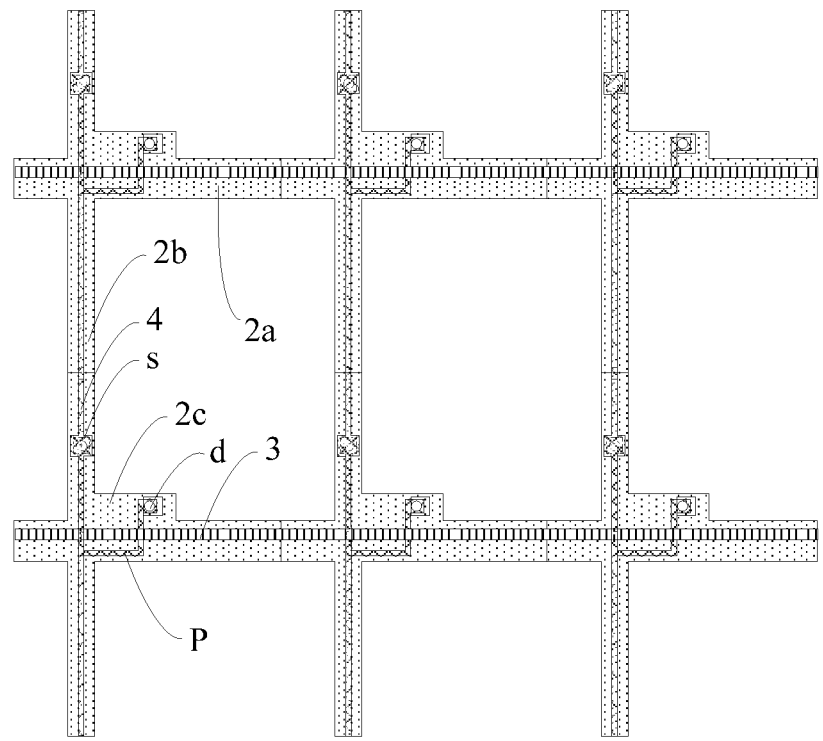
FIG. 8 is a schematic diagram showing a step-by-step structure of further manufacturing an array substrate in accordance with some embodiments of the present disclosure.

In step e, as shown in FIG. 8, data lines 4 and drains (marked as d in FIG. 8) are formed on the inter layer dielectric layer. A portion of a data line 4 that is connected to a source contact region through a via hole is directly used as a source of the TFT (marked as s in FIG. 8), and the drain is coupled to the drain contact region through the via hole.

The data lines 4 are blocked by the longitudinal portions 2b below, and the drains are blocked by the protruding portions 2c below.

After that, structures such as a planarization layer (PLN, as an organic film layer of a planarization layer), a pixel ITO (P-ITO) layer, a passivation layer (PVX), and a common ITO (C-ITO) are formed. The process may follow the prior art, which the embodiments of the present disclosure do not limit.

Figure 3:
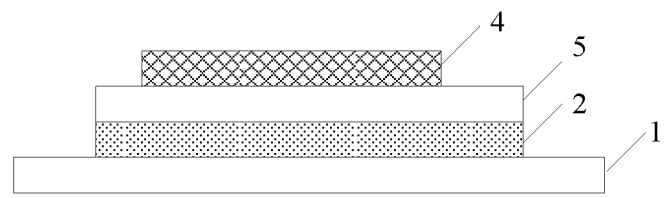
FIG. 3 is a sectional view of FIG. 2 taken along line A-A'.

Some embodiments of the present disclosure provide an array substrate obtained by using the manufacturing method described above. As shown in FIG. 2 and FIG. 3, the array substrate includes gate lines 3, data lines 4 and thin film transistors disposed above the base substrate, an electrostatic shielding layer 2 disposed on the base substrate 1, and the isolating layer 5 covering the electrostatic shielding layer 2. The gate lines 3, the data lines 4 and the thin film transistors are disposed on the isolating layer 5. An orthographic projection of a pattern of the electrostatic shielding layer 2 on the base substrate 1 covers an orthographic projection of at least one of a pattern of the gate lines, a pattern of the data lines and a pattern of the thin film transistors on the base substrate 1.

Thus, a shielding method may be adopted to avoid that the static electricity accumulated by the platform during the ESD is transmitted to a TFT through a corresponding gate line or a corresponding data line, or is directly transmitted to the TFT element, thereby avoiding various defects such as the bright spots and the black spots in a display product due to the ESD, and improving the product yield.

Figure 9:
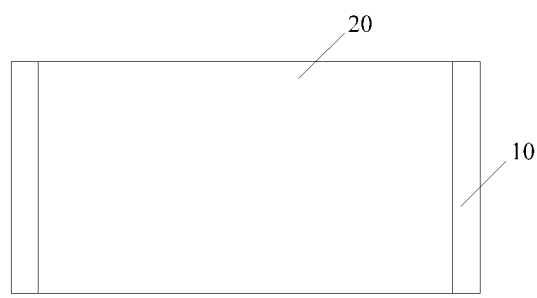
FIG. 9 is a schematic diagram showing a local structure of an array substrate in accordance with some embodiments of the present disclosure.

In some embodiments, the electrostatic shielding layer described above is disposed in a display area, i.e., the electrostatic shielding layer may shield the gate lines, the data lines and the TFTs in the display area from the static electricity. In some embodiments, the electrostatic shielding layer is disposed in a gate driver (abbreviated as GOA) area of the array substrate to shield structures in the GOA area from the static electricity. In some embodiments, the electrostatic shielding layer described above is disposed in the display area and the GOA area. In some embodiments, as shown in FIG. 9, a GOA areas 10 is disposed on each of two sides of a display area 20. In some other embodiments, a GOA area is disposed on one side of the display area.

In some embodiments, the electrostatic shielding layer includes ion-doped polysilicon, and the ion-doped polysilicon has a predetermined resistance. Thereby, the electrostatic shielding layer is not easy to generate a parasitic capacitance with at least one of the gate metal layer, the source-drain metal layer and the active layers in the TFTs, and an optimal shielding effect may be achieved.

Figure 10:
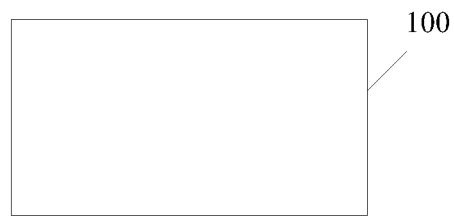
FIG. 10 is a schematic diagram of a display device in accordance with some embodiments of the present disclosure.

As shown in FIG. 10, some embodiments of the present disclosure provide a display device 100, and the display device includes the array substrate described above. The display device 100 is any product or component having a display function such as a liquid crystal display, a liquid crystal television, an organic electroluminescent display, an organic electroluminescent television, a digital photo frame, a mobile phone, a tablet computer or a navigator.

All the drawings of embodiments of the present disclosure are schematic diagrams of the array substrate described above, and are merely to clearly describe the structures related to a invention point in the solution. Other structures not related to the invention point are the existing structures and are not or only partially reflected in the drawings.

The foregoing descriptions are merely some implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. An array substrate, comprising:
an electrostatic shielding layer disposed on a base substrate;
an isolating layer covering the electrostatic shielding layer; and
gate lines, data lines and thin film transistors disposed on the isolating layer, wherein
orthographic projections of a pattern of the gate lines, a pattern of the data lines a pattern of the thin film transistors and a pattern of a gate driver (GOA) area of the array substrate on the base substrate are within a range of an orthographic projection of a pattern of the electrostatic shielding layer on the base substrate;
the electrostatic shielding layer is located in the display area of the array substrate and the GOA area of the array substrate; the GOA area is located in a non-display area; and
the electrostatic shielding layer comprises polysilicon doped with ions.

2. The array substrate according to claim 1, wherein the pattern of the electrostatic shielding layer comprises a plurality of lateral portions and a plurality of longitudinal portions, and the plurality of lateral portions and the plurality of longitudinal portions intersect each other to form a grid-like pattern,
an orthographic projection of a corresponding gate line on the base substrate is within a range of an orthographic projection of each lateral portion on the base substrate, and an orthographic projection of a corresponding data line on the base substrate is within a range of an orthographic projection of each longitudinal portion on the base substrate.

3. The array substrate according to claim 2, wherein the lateral portions further comprise a plurality of protruding portions formed on a same side and each connected to a corresponding longitudinal portion, and an orthographic projection of a corresponding thin film transistor on the substrate is within a range of an orthographic projection of a combination of a protruding portion, a portion of a lateral portion that is connected to the protruding portion, and a portion of a longitudinal portion that is connected to the protruding portion on the base substrate.

4. The array substrate according to claim 3, wherein,
a width of the lateral portion perpendicular to an extension direction of a corresponding gate line is greater than a line width of the gate line;
a width of the longitudinal portion perpendicular to an extension direction of a corresponding data line is greater than a line width of the data line; and
an area of a region where the combination of the protruding portion, the portion of the lateral portion that is connected to the protruding portion, and the portion of the longitudinal portion that is connected to the protruding portion is located is greater than an area of a region where the thin film transistor is located.

5. A method of manufacturing the array substrate according to claim 1, the method comprising:
forming the electrostatic shielding layer, and the isolating layer covering the electrostatic shielding layer on the base substrate in sequence; and
forming the gate lines, the data lines and the thin film transistors on the isolating layer, wherein
the orthographic projections of the pattern of the gate lines, the pattern of the data lines, the pattern of the thin film transistors and the pattern of the GOA area of the array substrate on the base substrate are within the range of the orthographic projection of the pattern of the electrostatic shielding layer on the base substrate,
the electrostatic shielding layer is located in the display area of the array substrate and the GOA area of the array substrate; the GOA area is located in the non-display area; and
the electrostatic shielding layer comprises polysilicon doped with ions.

6. The method according to claim 5, wherein forming an electrostatic shielding layer, comprises:
forming a polysilicon thin film covering the base substrate;
patterning the polysilicon thin film to form a polysilicon pattern layer; and
doping ions in the polysilicon pattern layer to form the electrostatic shielding layer, wherein the electrostatic shielding layer has a predetermined resistance.

7. The method according to claim 6, wherein after forming the electrostatic shielding layer, the method further comprises:
activating the electrostatic shielding layer by heating to increase an ordering degree of arranging the doped ions in the electrostatic shielding layer.

8. The method according to claim 5, wherein forming an electrostatic shielding layer comprises:
directly forming a nitrogen-doped polysilicon thin film covering the base substrate; and
patterning the nitrogen-doped polysilicon thin film to form the electrostatic shielding layer.

9. The method according to claim 5, wherein a pattern of the formed electrostatic shielding layer comprises:
a plurality of lateral portions and a plurality of longitudinal portions, wherein the plurality of lateral portions and the plurality of longitudinal portions intersect each other to form a grid-like pattern;
and an orthographic projection of a corresponding gate line on the base substrate, and an orthographic projection of each longitudinal portion on the base substrate covers an orthographic projection of a corresponding data line on the base substrate is within a range of an orthographic projection of each lateral portion on the base substrate.

10. The method according to claim 9, wherein, the lateral portions further comprises a plurality of protruding portions formed on a same side and each connected to a corresponding longitudinal portion, an orthographic projection of a corresponding thin film transistor on the substrate is within an orthographic projection of a combination of a protruding portion, a portion of a lateral portion that is connected to the protruding portion, and a portion of a longitudinal portion that is connected to the protruding portion on the base substrate.

11. The method according to claim 10, wherein
a width of the lateral portion perpendicular to an extension direction of a corresponding gate line is greater than a line width of the gate line;
a width of the longitudinal portion perpendicular to an extension direction of a corresponding data line is greater than a line width of the data line; and
an area of a region where the combination of the protruding portion, the portion of the lateral portion that is connected to the protruding portion, and the portion of the longitudinal portion that is connected to the protruding portion is located is greater than an area of a region where the thin film transistor is located.

12. A display device, comprising the array substrate according to claim 1.

* * * * *